United States Patent [19]

Speer

[11] 4,347,628

[45] Aug. 31, 1982

[54] ROTARY TUNING MECHANISM

[75] Inventor: Walter F. Speer, Speedway City, Ind.

[73] Assignee: RCA Corporation, New York, N.Y.

[21] Appl. No.: 201,440

[22] Filed: Oct. 28, 1980

[51] Int. Cl.³ .............................. H04B 1/16; H03J 5/04
[52] U.S. Cl. .................................... 455/173; 74/10.41; 334/51; 334/88
[58] Field of Search ............... 455/157, 170, 173, 177; 334/49–51, 88; 358/191.1, 195.1; 74/10.41

[56] References Cited

U.S. PATENT DOCUMENTS

| | | | |
|---|---|---|---|
| 3,466,549 | 9/1969 | Milnes | 334/88 |
| 3,842,683 | 10/1974 | Valdettaro | 334/51 |
| 3,870,961 | 3/1975 | Suzuki | 455/173 |
| 3,982,187 | 9/1976 | Badger et al. | 455/173 |

FOREIGN PATENT DOCUMENTS 266800  8/1964  Netherlands .......................... 334/88

OTHER PUBLICATIONS

Tuning Mechanism Drawing and Photographs corresponding to part nos. 102578 and 41098001 of Noble Corporation of Japan.
EEM 79/80, Electronic Engineers Master Catalog, 22nd Edition, vol. 2, pp. 3782, 3784.

Primary Examiner—Marc E. Bookbinder

Attorney, Agent, or Firm—E. M. Whitacre; P. J. Rasmussen; P. M. Emanuel

[57] ABSTRACT

A rotary tuning mechanism comprises an integral dielectric structure including a gear wheel with a first set of teeth extending from a first face surface and a second set of teeth extending radially from a circumferential surface, a shaft attached to the gear wheel and a spacer ring attached to a second face surface of the gear wheel. The gear wheel is sandwiched between two planar housing sections with the spacer ring urged against a first planar section and the first set of teeth urged against detent ball bearings supported within respective apertures in the second planar section by a flat spring and symmetrically disposed with respect to the axis of the gear wheel and shaft. An AFT defeat switch is mounted to engage the second set of teeth. The housing is mounted on a printed circuit board containing a rotary switch for selecting various tuning circuits associated with respective channels. A dielectric channel indicator wheel fits over the rotary switch. The shaft extends through an aperture in the printed circuit, rotary switch and channel indicator wheel and engages keyed portions of the latter two. The entire mechanism is mounted at the side of a television receiver with the axis directed sidewardly in a planar subassembly formed of a dielectric material having an aperture just slightly larger than the channel indicator wheel so that the face of the channel indicator wheel and planar subassembly form a side portion of the cabinet of the receiver.

10 Claims, 7 Drawing Figures

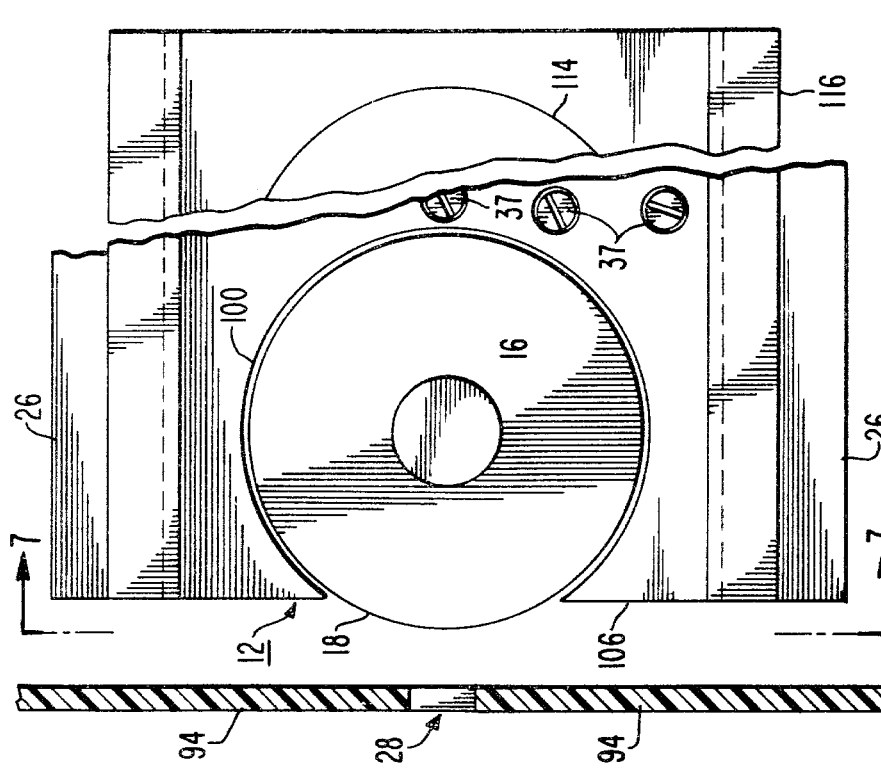
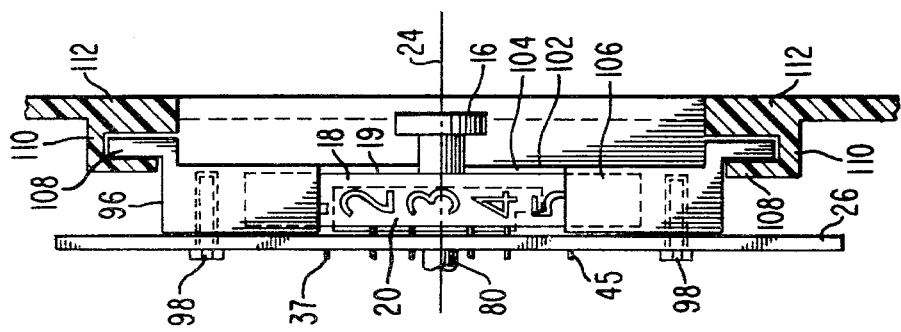

ROTARY TUNING MECHANISM

The present invention relates to the field of rotary tuning mechanisms of the type having a detent assembly for selectively retaining the mechanism in angular positions corresponding to channels and an automatic fine tuning (AFT) defeat assembly for automatically inhibiting the operation of automatic fine tuning circuitry between the channel positions. In this type of tuning mechanism, a channel indicator, e.g., comprising a wheel with channel numbers along its periphery, is usually provided to indicate selected channels.

For the most part rotary tuning mechanisms are intended to be located on the front of the cabinet of a television receiver on one side of the screen of the picture tube, with their axes directed toward the rear of the receiver. In such arrangements there is adequate room for the tuning mechanism in the axial direction.

Presently, television manufacturers are striving to make portable television receivers which are small, compact and lightweight. Toward this end it is desirable to locate the channel indicator wheel of a rotary tuning system of the type described above on the side of the cabinet of the television receiver with the axis of the tuning mechanism directed toward the side of the picture tube, as is indicated in FIG. 1, rather than on the front of the cabinet of the receiver. This allows for a relatively small front surface area. However, since the dimension between the side of the cabinet and the side of the picture tube is small, the axial dimension of the tuning mechanism should be small. In addition, the tuning mechanism should provide complete electrical isolation between users and electrical components. The present invention is directed toward these ends consistent with a cost effective construction.

Specifically, one feature of the present invention concerns a rotary tuning mechanism having a gear wheel with a first set of gear teeth on a face surface and a second set of gear teeth on a circumferential surface. One of the sets of teeth engages a detent element, such as a ball bearing, while the other set of teeth engages a switch for defeating AFT circuitry of the receiver.

As a further feature of the present invention a spacer which defines a planar surface substantially parallel to the surface of the gear wheel is attached the the gear wheel. The gear wheel and spacer are snugly held, i.e., "sandwiched", between two planar housing members. The first planar housing member contacts the spacer. The second planar housing member includes a flat spring for retaining ball bearings which engage the gear teeth on the face surface of the gear wheel. Desirably, the spacer gear wheel and an associated shaft are integrally formed, e.g., from molded plastic material.

Still another feature of the present invention concerns a rotary tuning mechanism in which a rotary switch for selecting tuning circuits for respective channels is axially located within a dielectric channel indicator wheel.

The present invention will be described in detail with reference to the following Figures of the accompanying Drawing.

FIG. 6 is a side view of a subassembly for mounting the rotary tuning mechanism of FIG. 3 within a television receiver between a side of the cabinet and a side of the picture tube; and FIG. 7 is a sectional view of the subassembly of FIG. 6 taken in the direction of section lines 7—7 of FIG. 6.

Figure 1:
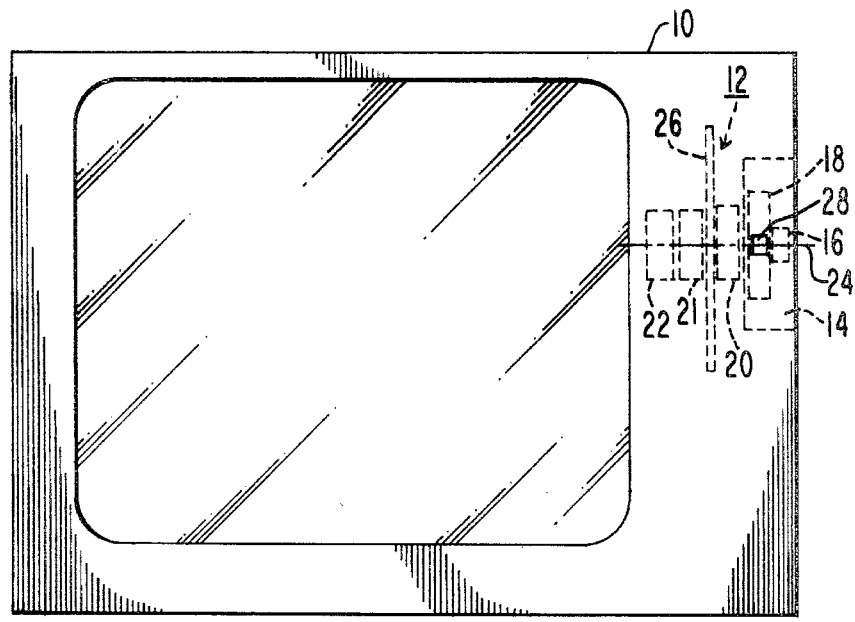
FIG. 1 is a front view of a television receiver and indicates schematically the manner in which a rotary tuning mechanism may be incorporated between a side of the cabinet and a side of the picture tube as referred to above.

In FIG. 1, a television receiver 10 includes a tuning mechanism generally indicated as 12 located within a recess 14 in a side of the cabinet of receiver 10. Tuning mechanism 12 is of the rotary type and includes a tuning knob 16, a channel identification wheel 18, a rotary switch 20, a detent positioning assembly 21 and an AFT defeat assembly 22 which are axially aligned along an axis 24. A printed circuit board 26 between rotary switch 20 and assembly 21 supports the electrical components associated with tuning mechanism 12. Channels are selected by manually rotating tuning knob 16 to angular positions defined by detent positioning assembly 21. As will be described below in more detail with reference to FIG. 2, as tuning knob 16 is rotated, a wiper of switch 20 contacts successive switch contacts associated with respective channels. Each switch contact is connected to a respective tuning circuit on printed circuit 26 for tuning the respective channel. Channel numbers are printed on the cylindrical surface of channel identification wheel 18. The channel number of a selected channel is displayed through a window 28 on the front of the cabinet of television receiver 10.

Figure 2:
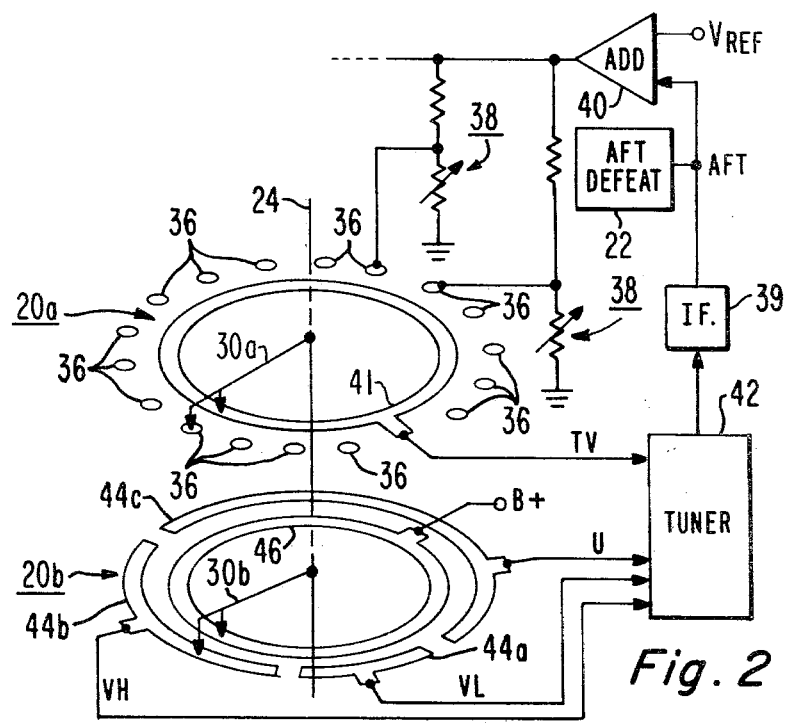
FIG. 2 is an electrical schematic showing the arrangement of electrical components of the rotary tuning mechanism shown in FIG. 1.

In FIG. 2, switch 20 includes two switch sections 20a and 20b having respective wipers 30a and 30b which are mechanically linked to tuning knob 16 by a shaft (not shown) along axis 24. Switch section 20a contains a predetermined number of contacts 36 corresponding to respective channels. In the United States there are twelve VHF (very high frequency) broadcast channels and seventy UHF (ultra high frequency) broadcast channels. Typically a majority of the VHF channels but only a few, e.g., six, of the UHF channels are receivable in any given broadcast area. Accordingly, a suitable number of contacts 36 for switch 20 is eighteen,. Each of contacts 36 is connected to a respective potentiometer arrangement 38 (supported on printed circuit board 26) for developing a respective DC tuning voltage from a reference voltage (VREF) and an automatic fine tuning (AFT) voltage developed by an AFT discriminator within an intermediate frequency section 39 of the receiver after combination in an adding circuit 40. When wiper 32a makes contact with one of contacts 36, the voltage developed by the respective potentiometer arrangement 38 is coupled through wiper 32a to a commutating ring 41 and thereby to tuner 42.

Since there are tuning positions for all of the VHF channels, the channel numbers for all the VHF channels, e.g., 2 through 13, are formed on the circumferential surface of channel indicator wheel 18 and the corresponding potentiometer arrangements 38 are preadjusted by the manufacturer before shipment. However, since it is not known in advance what UHF channels are receivable in a given broadcast area, replaceable inserts with letters, e.g., A through F, are provided within suitable slots on channel identification wheel 18 for the predetermined number, e.g., six, of UHF channels and the corresponding potentiometer arrangements 38 are left to be adjusted by users. When the user has determined the receivable UHF channels, the letter inserts are replaced by inserts with the appropriate UHF channel numbers supplied by the manufacturer with the receiver and the corresponding potentiometer arrangements 38 are appropriately adjusted.

Since the purpose of the AFT signals is to compensate for the thereby inhibit changes in tuning due, e.g., to temperature and component variations, the AFT signal is inhibited from being coupled to adding circuit 40 by AFT defeat assembly 22 when tuning knob 16 is rotated to intentionally change the tuning. Since conventional AFT circuits employed in television receivers provide both a non-inverted and an inverted AFT signal, AFT defeat assembly 22 may be arranged to short the opposite polarity AFT signal leads together as tuning knob 16 is rotated between channels.

Tuner 42 includes a radio frequency (RF) section for selecting the RF carrier associated with a selected channel, a local oscillator section for generating a local oscillator signal having the appropriate frequency for heterodyning the selected RF carrier to produce an intermediate frequency (IF) signal and a mixer for heterodyning the selected RF carrier and appropriate local oscillator signal. The RF and local oscillator sections include respective voltage tuned circuits each comprising a respective voltage controlled capacitance diode (conventionally called a varactor diode) responsive to the magnitude of the voltage developed by the selected potentiometer arrangement 58 in combination with an inductor configuration as the frequency determining elements. A single varactor diode in combination with a single inductor configuration cannot be tuned over the entire television range. For this reason, in conventional voltage controlled tuners employed in television receivers, separate VHF and UHF tuner sections are selectively enabled depending on whether the selected channel is in the VHF or UHF band and the inductor configurations of the VHF tuner section are changed depending on whether the selected channel is in a low or high portion of the VHF band, e.g., channels 2 through 6 and 7 through 13, respectively, in the United States. Section 20b of switch 20 generates band switching control voltages indicative of the frequency band in which the selected channel resides for the latter purpose.

Switch section 20b of switch 20 has a ring segmented into three sections 44a, 44b and 44c. Each of sections 44a, 44b and 44c corresponds to a group of channels in a respective band. Specifically, for the television broadcast channels in the United States, section 44a corresponds to the low VHF channels 2 through 6, section 44b corresponds to the high VHF channels 7 through 13 and section 44c corresponds to the UHF channels 14 through 83. When wiper 30a is in contact with one of contacts 36, wiper 30b is in contact with a respective one of sections 44a, 44b and 44c. A voltage (B+), coupled to a commutating ring 46, is selectively coupled by wiper 36b to sections 44a, 44b and 44c and thereby to respective LV (low VHF), HV (high VHF) and U (UHF) band switching control lines coupled to tuner 42.

Circuits suitable for use in the tuning arrangement generally described with reference to FIG. 2 are disclosed in detail in "RCA Service Data-CTC81 Series Chassis", File 1975, C-7, published by RCA Corporation, Indianapolis, Indiana, hereby incorporated by reference. A type VT2142WO switch or the like, manufactured by CTS Corporation, Elkhart, Indiana, is suitable for use as switch 20.

Returning now to FIG. 1, the axial dimension of tuning mechanism 12 is defined by the distance between the side of the cabinet of receiver 10 in which recess 14 is formed and the corresponding side of a picture tube 48. So that the width of television receiver 10 can be made small as possible, it is desirable that the axial dimension of tuning mechanism 12 be as small as possible. The present tuning mechanism to be described in detail with reference to FIGS. 3, 4, 5, 6 and 7 has an arrangement incorporating a channel identification wheel, rotary switch, detent assembly and AFT defeat directed toward the latter purpose and also at providing electrical isolation.

In the following description of the present rotary tuning mechanism 12, concurrent reference to FIGS. 3, 4 and 5 will be helpful.

The detent and AFT disabling arrangement of tuning mechanism 12 includes a tuning wheel 50 having a peripheral or circumferential surface 51 and a face surface 52a. A first set of gear teeth 53 is formed on circumferential surface 51 and a second set of gear teeth 54 is formed on face surface 52a. Teeth 53 extend from circumferential surface 51 in substantially perpendicular directions. Teeth 54 extend from face surface 52a in substantially radial directions. Accordingly, teeth 53 are substantially orthogonal to teeth 54. As shown, teeth 53 and teeth 54 are in substantial registry with high points 53a of teeth 53 in substantial alignment with high points 54a of teeth 54 and low points 53b of teeth 53 in substantial alignment with low points 54b of teeth 54.

A spacer ring 56 extends from a face surface 52b of gear wheel 50 opposite face surface 52a. Spacer 56 engages a first planar section 58 of a housing 60. Gear teeth 54 engage ball bearings 62a and 62b retained within respective openings of a second planar section 64 of housing 60 by a flat spring 66 fastened to the second planar section 64 by eyelets 68. End sections 70a and 70b, which are formed from the same piece of sheet metal as planar section 58, are bent substantially perpendicular to planar section 58. End sections 70a and 70b have respective tabs 72a and 72b which are extended through respective slots in second planar section 64 and are twisted to retain housing sections 58, 64, 70a and 70b together so as to form housing 60. End sections 70a and 70b should be somewhat undersized in length so that planar sections 58 and 64, in cooperation with spacer 56, ball bearings 62a and 62b and flat spring 66, snugly retain or "sandwich" gear wheel 50 within housing 60.

Figure 4:
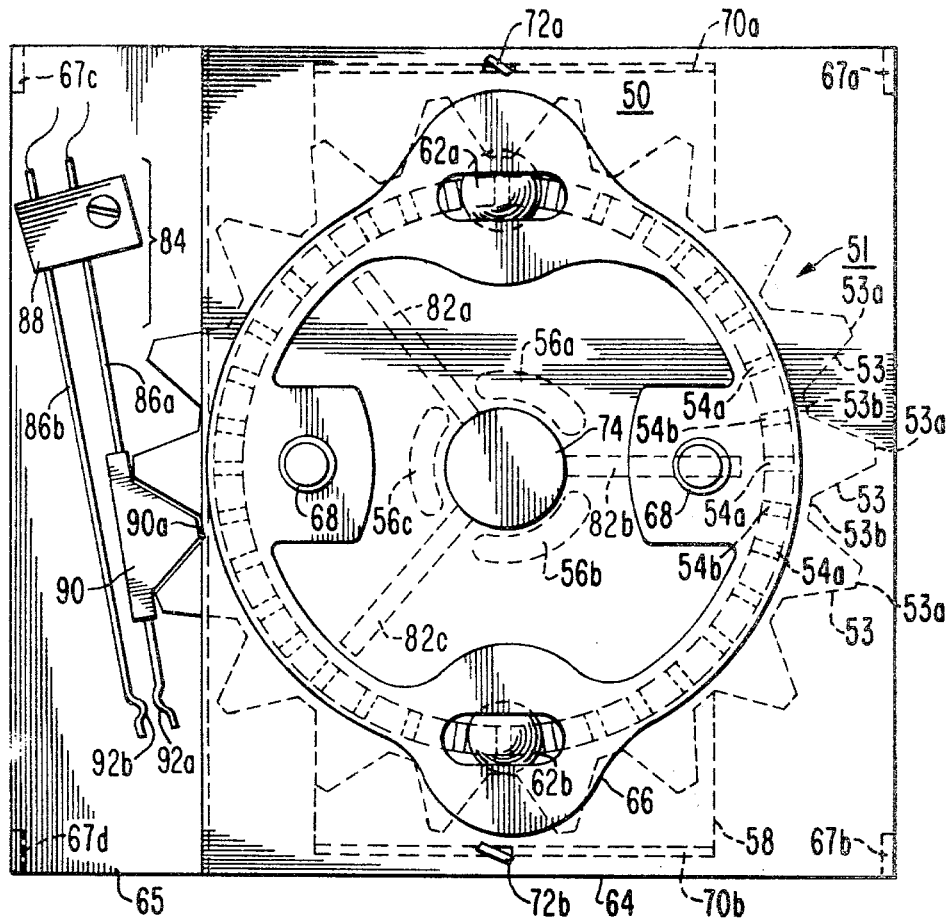
FIG. 4 is a back view of the rotary tuning mechanism of FIG. 3 taken in the direction of section lines 4—4 of FIG. 3.
Figure 5:
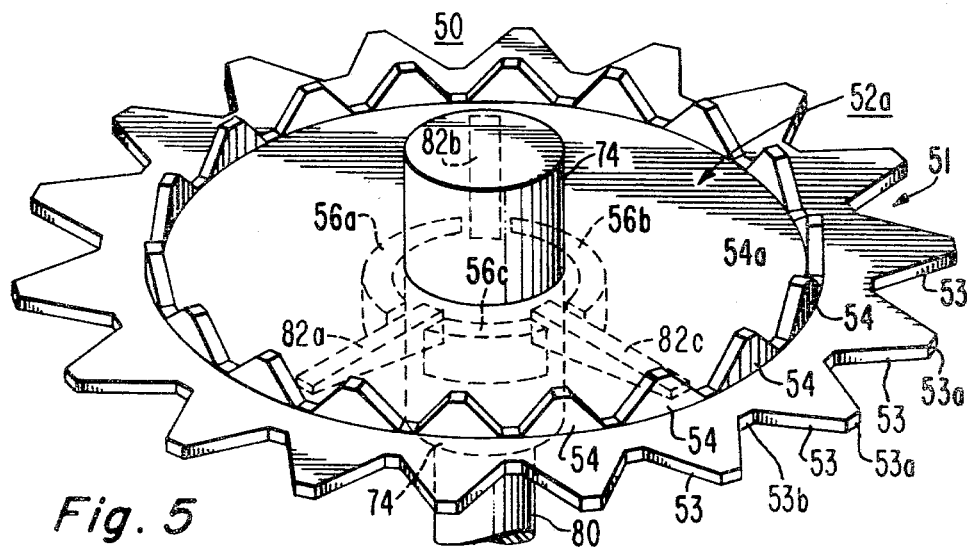
FIG. 5 shows a perspective view of portions of the rotary tuning mechanism shown in FIGS. 3 and 4.

As is shown in FIG. 4, a lower surface 65 (i.e., lower than surface 64 into the plane of the drawing sheet) is integrally attached to second planar section 64. Legs 67a and 67b extend perpendicularly from planar surface 64 and legs 67c and 67b extend perpendicularly from lower surface 65 through respective apertures in printed circuit board 26 and respective end tabs are twisted to secure housing 60 to printed circuit board 26. Desirably surfaces 64 and 65 and legs 67a, 67b, 67c and 67d are formed (i.e., stamped and bent) from the same piece of sheet metal.

A shaft 74 is in coaxial alignment with gear wheel 50 and spacer 56. Shaft 74 extends through respective apertures in planar sections 58 and 64 and printed circuit board 26. A keyed end 80 of shaft 74 passes through and engages respective similarly shaped apertures of section 20a and 20b of switch 20, channel indicator wheel 18 and tuning knob 16 so that as tuning knob 16 is rotated, channel indicator wheel 18, wipers 30a and 30b of sections 20a and 20b, respectively, of switch 20 and gear teeth 53 and 54 are synchronously rotated. Terminals 37, connected to respective contacts 36 of switch section 20a, are soldered to respective conductor paths on printed circuit board 26. Similarly, terminals 45 (only one is shown), connected to respective members 44a, 44b, 44c and 46 of switch section 20b, are soldered to respective conductor paths of printed circuit board 20b.

Figure 3:
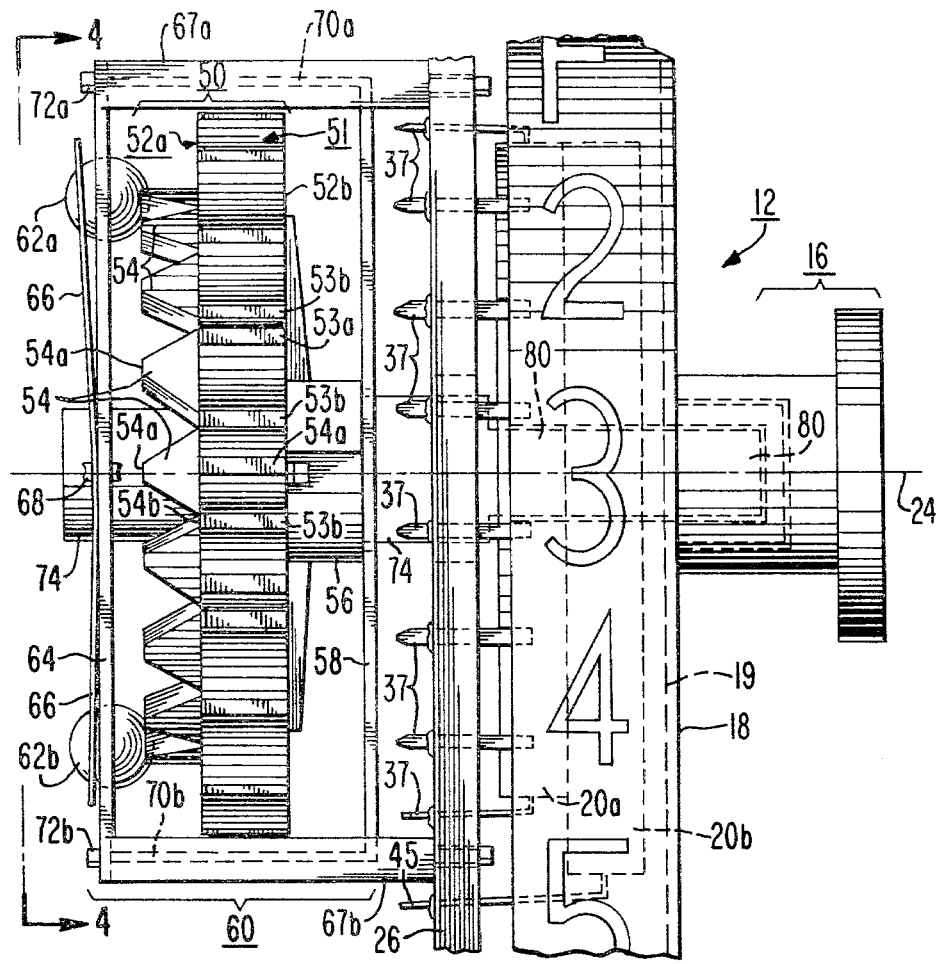
FIG. 3 is a side view of a rotary tuning mechanism constructed in accordance with the present invention.

To shorten the axial dimension of rotary tuning mechanism 12 channel indicator wheel 18 is hollow and substantially all of switch 20 is positioned within the hollow portion of channel indicator wheel 18 as is indicated by the position of inner wall 19 shown in FIG. 3. As will be described below, since channel indicator wheel 18 covers switch 20, it also electrically isolates users from switch 20 and the electrical components on printed circuit board 26 connected to switch 20.

To prevent undue friction which tends to hamper the rotational movement of rotary tuning mechanism 12, spacer ring 56 is desirably segmented into sections 56a, 56b and 56c. The segmentation of spacer ring 56 reduces the surface area of spacer ring 56 which engages planar section 58 of housing 60 and therefore reduces the friction between spacer 56 and planar section 58. Radial re-enforcing ribs 82a, 82b and 82c are provided between sections 56a, 56b and 56c to inhibit flexing of gear wheel 50.

Preferably, gear wheel 50, gear teeth 53, spacer ring 56, shaft 74, keyed end section 80 and ribs 82a, 82b and 82c are an integral one piece assembly formed, e.g., by plastic molding. A plastic made under the trademark of "Valox 420" manufactured by General Electric Corporation has been found suitable for this purpose. Since shaft 74 and end section 80 are plastic, users are electrically isolated from electrical components within television receiver 10. Further to this purpose, it is preferable that channel indicator wheel 18 and tuning knob 16 are also formed of a suitable plastic material.

In operation, ball bearings 62a and 62b engage with the areas between gear teeth 54 on the face of gear wheel 50 to provide detent action for rotary tuning mechanism 12. The use of two ball bearings symmetrically disposed about the axis of tuning mechanism 12 tends to balance the forces acting on it in directions parallel to axis 24 thereby inhibiting undesirable stresses between wheel 50 and shaft 74.

With reference to FIG. 4, a normally open switch 84 is attached to lower surface 65. Switch 84 comprises two substantially parallel elongated flat metal contact leafs 86a and 86b each supported at one end within a dielectric, e.g., plastic, piece 88 secured, e.g., by a screw to surface 65. Respective ends of contacts 86a and 86b are connected to respective opposite polarity output leads of the AFT circuit. A cam element 90 generally shaped to conform with the areas between teeth 54 is attached to the other end of contact 86a. As gear wheel 50 is rotated, gear teeth 54 engage cam element 90 and thereby urge contacts 86a and 86b together. Switch 84 is arranged so that when high points 54a of teeth 54 are in contact with a high point 90a of cam element 90, contact points 92a and 92b of contact leafs 86a and 96b, respectively, are touching. The latter causes the two output leads of the AFT circuit to be shorted together thereby causing the opposite polarity AFT signals to effectively cancel one another so as to have no affect on tuner 42.

Detent position assemblies in which a spring loaded member engages teeth on the circumferential surface of a gear wheel are known. However, these require a separate supporting structure for the spring loaded member. In contrast, in the present arrangement in which teeth 54 on face surface 52a engage ball bearings 62a and 62b symmetrically disposed about axis 24 is preferred because it does not require a separate supporting structure for ball bearings 62a and 62b. That is ball bearings 62a and 62b are conveniently held in respective apertures in planar housing section 64 between flat spring 66 and teeth 54. In addition, in the present detent arrangement the only forces directed in directions perpendicular to axis 24 are the relatively insignificant ones due to switch cam 90. Accordingly, shaft 74 may be formed from plastic rather than from a more rigid material such as metal. Still further, since the significant forces acting on gear wheel 50 are directed in directions parallel to axis 24, the supporting structure for housing 60 in directions perpendicular to axis 24 need not be appreciable and may therefore be readily supported by printed circuit board 26.

While the cooperation of teeth 54 extending from face surface 52a of gear wheel 50 and ball bearings 62a and 62b supported within planar housing section 64 offers the advantages of a detent mechanism described above, it offers no practical arrangement for an AFT defeat mechanism. The present AFT defeat arrangement in which teeth 53 extend from circumferential surface 51 of gear wheel 50 to engage in radial fashion with cam element 90 of switch 84 accomplishes this. Moreover because of the radial cooperation it is advantageous in maintaining a relatively small axial dimension. This is of particular concern when the rotary tuning mechanism is to be mounted sidewardly within the receiver as is schematically indicated in FIG. 1.

FIGS. 6 and 7 indicate the manner in which rotary tuning mechanism 12 may be incorporated within receiver 10 between a side of the cabinet and a corresponding side of the picture in the manner schematically represented in FIG. 1. FIGS. 6 and 7 should be referred to concurrently.

In the sectional view of FIG. 6 elements 94 are sections of the front of the cabinet directly in front of rotary tuning mechanism 12 with window 28 for displaying the channel number of the presently selected channel. As is shown in the sectional view of FIG. 7, taken in the direction of section lines 7—7 of FIG. 5, keyed end section 80 of shaft 74 extends through printed circuit board 26, switch 20 and into channel identification wheel 18 and tuning knob 16 as previously described with reference to FIG. 3. Printed circuit board 26 is attached to a slideable assembly by screws 98 or the like. Channel indicator wheel 18 fits into an aperture 100 of just larger dimension in side surface 102 of slideable assembly 96. Channel indicator wheel 18 protrudes through an opening 104 in front surface 106 of slideable assembly 96. Access to potentiometer 37 of potentiometer arrangements 38 mounted on printed circuit board 26 is provided through respective apertures in side surface 102 of slideable assembly 96. Slides 108 of slideable assembly 96 are received by members 110 integrally formed with slide 112 of the cabinet of the receiver. (In FIG. 5 members 110 have been omitted for clarity.)

Desirably slideable assembly 96 and the cabinet are formed of plastic.

Slideable assembly 96 removeably retains rotary tuning mechanism 12 within television receiver 10 in the manner schematically indicated in FIG. 1. Slideable assembly 96 may also be used to support other portions of television receiver. By way of example, an aperture 114 may be provided in reward section 116 for supporting a speaker (not shown).

As earlier noted channel indicator wheel 18 is hollow so as to be able to contain switch 20. Channel indicator wheel 18 thus electrically isolates the electrical components of switch 20 from contact by a user. Slideable assembly 96 covers the remaining portion of printed circuit board 26 with which a user may come in contact. It is noted in this connection that side surface 19 of channel identification wheel 18, side surface 102 and slideable assembly 96 form the inner wall of recess 14 indicated in FIG. 1.

While the present tuning mechanism has been described as having a gear wheel with orthogonal gear teeth having their high and low points in substantial alignment, it should be appreciated that teeth 53 and 54 can be angularly offset with respect to each other if the position of cam element 92 or switch 84 is correspondingly shifted. Further, while gear teeth 53 and 54 are shown as having generally triangular shapes, they may assume other more rounded shapes if desired. Still further, while gear teeth 53 and 54 have been described as being orthogonal, other angular displacements may be employed. These and other modifications to the present invention are intended to be within the scope of the present invention as defined by the following claims.

What is claimed is:

1. In a receiver tuning apparatus system including an automatic fine tuning (AFT) circuit, apparatus comprising:
   a gear wheel having an axis and a circumferential surface disposed around said axis and a face surface substantially perpendicular to said axis;
   a plurality of first teeth extending from said circumferential surface;
   a plurality of second teeth extending from said face surface;
   a shaft directed along the axis of said gear wheel;
   a spacer having at least one surface defining a plane substantially perpendicular to said axis at a predetermined distance from said face surface;
   said gear wheel, said first and second teeth, said shaft and said spacer being part of an integral structure of a dielectric material;
   a housing having first and second planar sections;
   said surface of said spacer engaging said first planar section at said predetermined distance;
   at least two detent members symmetrically disposed about said axis and supported by said second planar section to engage said second teeth;
   means connecting said first and second planar sections for urging said detent members against ones of said second teeth and for urging said surface of said spacer against said first planar section; and
   a switch connected to said AFT circuit and having a contact member located so that said contact member engages said first teeth.

2. The apparatus recited in claim 1 further including:
   a printed circuit board supporting a plurality of tuning circuits;
   means for supporting said housing on said printed circuit board so that said first and second planar sections and substantially parallel to the plane of said printed circuit board; and
   a rotary switch having a plurality of contacts connected to respective ones of said circuits and at least one wiper rotationally attached to said switch to selectively contact said contacts when rotated;
   said shaft extending through an aperture in one of said first and second planar sections and through an aperture in said rotary switch, said wiper engaging said shaft to be rotated thereby.

3. The apparatus recited in claim 2 further including:
   a channel indicator wheel having an axis and a circumferential surface on which is located symbols for identifying respective channels;
   said shaft extending into an aperture in said channel indicator wheel in substantial axial alignment therewith, said channel indicator wheel engaging said shaft to be rotated thereby.

4. The apparatus recited in claim 3 wherein:
   said channel indicator wheel has a hollow portion; and
   said rotary switch is located within said hollow portion of said channel indicator wheel.

5. The apparatus recited in claim 4 wherein:
   said channel indicator wheel is a dielectric material.

6. The apparatus recited in claim 5 wherein said receiver is a television receiver including a picture tube with a screen at the front of the cabinet of the receiver and further including:
   a planar assembly member formed of a dielectric material and having a circular aperture with a diameter slightly larger than the diameter of the circumferential surface of said channel indicator wheel;
   means for attaching said planar assembly member to said printed circuit board so that said printed circuit board is substantially parallel to said planar assembly member and so that said channel indicator is within said aperture of said planar assembly member; and
   means for attaching said planar assembly member to a side of said cabinet.

7. The apparatus recited in claim 1 wherein:
   said spacer is a cylindrical ring symmetrically disposed around the axis of said gear wheel and attached to said gear wheel on a second face surface opposite said first mentioned face surface.

8. The apparatus recited in claim 7 wherein:
   said cylindrical ring is segmented into sections.

9. The apparatus recited in claim 8 further including:
   re-enforcing ribs radially disposed from said axis on one of said first and second face surfaces and integral with and of the same dielectric material as said gear wheel, said first and second teeth, said shaft and said spacer.

10. The apparatus recited in claim 9 wherein:
    said re-enforcing ribs extend from said shaft between said sections of said cylindrical ring on the second face surface.

* * * * *